(12) United States Patent
Hsu

(10) Patent No.: US 7,121,697 B2
(45) Date of Patent: Oct. 17, 2006

(54) ILLUMINATION DEVICE FOR COMPUTER FAN

(76) Inventor: Sam Hsu, No. 13, Alley 86, Lane 412, Jennshin Rd., Taichung City (TW)

( * ) Notice: Subject to any disclaimer, the term of this patent is extended or adjusted under 35 U.S.C. 154(b) by 224 days.

(21) Appl. No.: 10/932,838

(22) Filed: Sep. 1, 2004

(65) Prior Publication Data
US 2006/0044757 A1    Mar. 2, 2006

(51) Int. Cl.
*F21V 33/00* (2006.01)
(52) U.S. Cl. ............... 362/386; 362/253; 362/234; 310/73; 416/5
(58) Field of Classification Search ........... 362/234, 362/253, 240, 250, 272, 285, 286, 372, 386, 362/800, 418–425; 310/73, 66; 416/5
See application file for complete search history.

(56) References Cited

U.S. PATENT DOCUMENTS

| 6,588,913 | B1 * | 7/2003 | Huang | 362/96 |
| 6,790,003 | B1 * | 9/2004 | Hu et al. | 416/5 |
| 6,923,552 | B1 * | 8/2005 | Tseng | 362/192 |
| 7,037,073 | B1 * | 5/2006 | Lin | 416/5 |
| 7,055,977 | B1 * | 6/2006 | Lai | 362/253 |

* cited by examiner

*Primary Examiner*—Sandra O'Shea
*Assistant Examiner*—Bao Q. Truong
(74) *Attorney, Agent, or Firm*—Pro-Techtor Int'l Services

(57) ABSTRACT

An illumination device comprises a rotating member secured to a hub of a fan of a computer having a transparent case and including LEDs, a receptacle formed above a center, the receptacle including a projected head and an internal electromagnet, control circuits each for periodically controlling an on or off of one or more of the LEDs, a coil of wire surrounded by the electromagnet, and positive and negative terminals; and a fixed member secured to the fan and including a central slot snugly coupled to the head for fastening the receptacle and the fixed member together. Turning on the computer, the fan, the rotating member, and the coil of wire will rotate so as to cut magnetic lines across a space defined by the electromagnet, induce a voltage in the terminals, and illuminate or flash the LEDs.

7 Claims, 6 Drawing Sheets

ILLUMINATION DEVICE FOR COMPUTER FAN

FIELD OF THE INVENTION

The present invention relates to illumination devices and more particularly to a rotatable illumination device mounted on a fan of a computer having a transparent case such that an illumination and/or flashing of the illumination device can indicate a normal operation of the fan.

BACKGROUND OF THE INVENTION

Conventionally, the purpose of installing a fan in a computer is to dissipate heat generated during operation. However, other features of the fan have not been developed as far as the present inventor is aware. Thus, continuing improvements in the exploitation of computer fan are constantly being sought.

SUMMARY OF THE INVENTION

It is an object of the present invention to provide a rotatable illumination device mounted on a fan of a computer having a transparent case such that an illumination and/or flashing of the illumination device can indicate a normal operation of the fan.

It is another object of the present invention to provide a plurality of IC based control circuits each for controlling the on or off of one or more corresponding light-emitting members such that brightness and/or flashing of the light-emitting members can be periodically changed when the computer operates.

To achieve the above and other objects, the present invention provides an illumination device for a fan of a computer having a transparent case, comprising a rotating member releasably secured to a hub of the fan and including a plurality of light-emitting members disposed on an upper surface, a receptacle formed above a center by a predetermined distance, the receptacle including a projected head and an internal electromagnet, a plurality of control circuits provided on a bottom each for periodically controlling an on or off of one or more of the light-emitting members, a coil of wire surrounded by the electromagnet, and positive and negative terminals wherein the terminals, the light-emitting members, and the control circuits form a circuit; and a fixed member releasably secured to the fan and including a central slot snugly coupled to the head for fastening the receptacle and the fixed member together, whereby turning on the computer, the fan, the rotating member, and the coil of wire will rotate so as to cut magnetic lines across a space defined by the electromagnet, induce a voltage in the terminals, and illuminate or flash the light-emitting members.

The above and other objects, features and advantages of the present invention will become apparent from the following detailed description taken with the accompanying drawings.

DETAILED DESCRIPTION OF THE PREFERRED EMBODIMENTS

Figure 1:
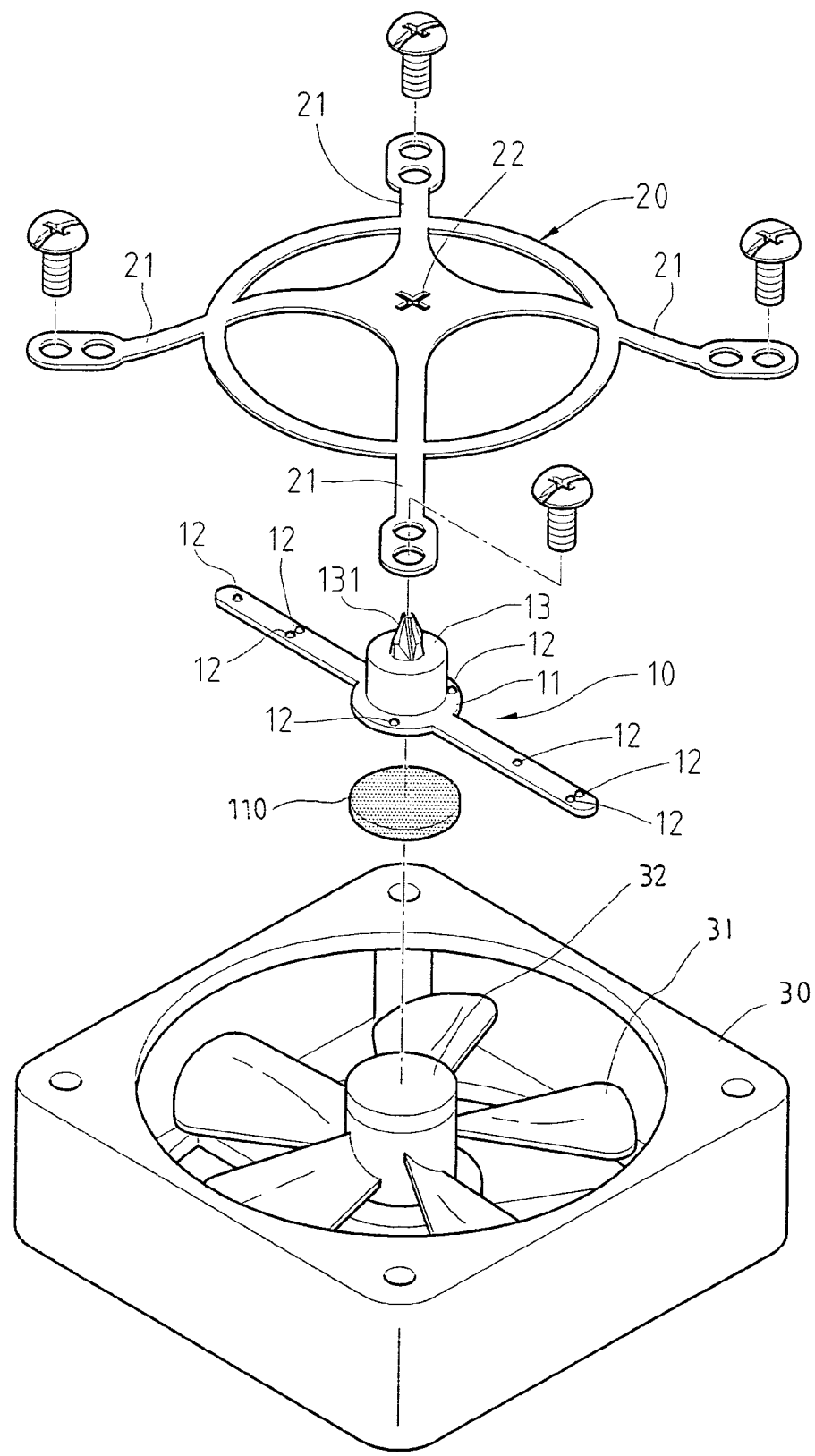
FIG. 1 is an exploded view of an illumination device according to the invention to be mounted on a computer fan.
Figure 2:
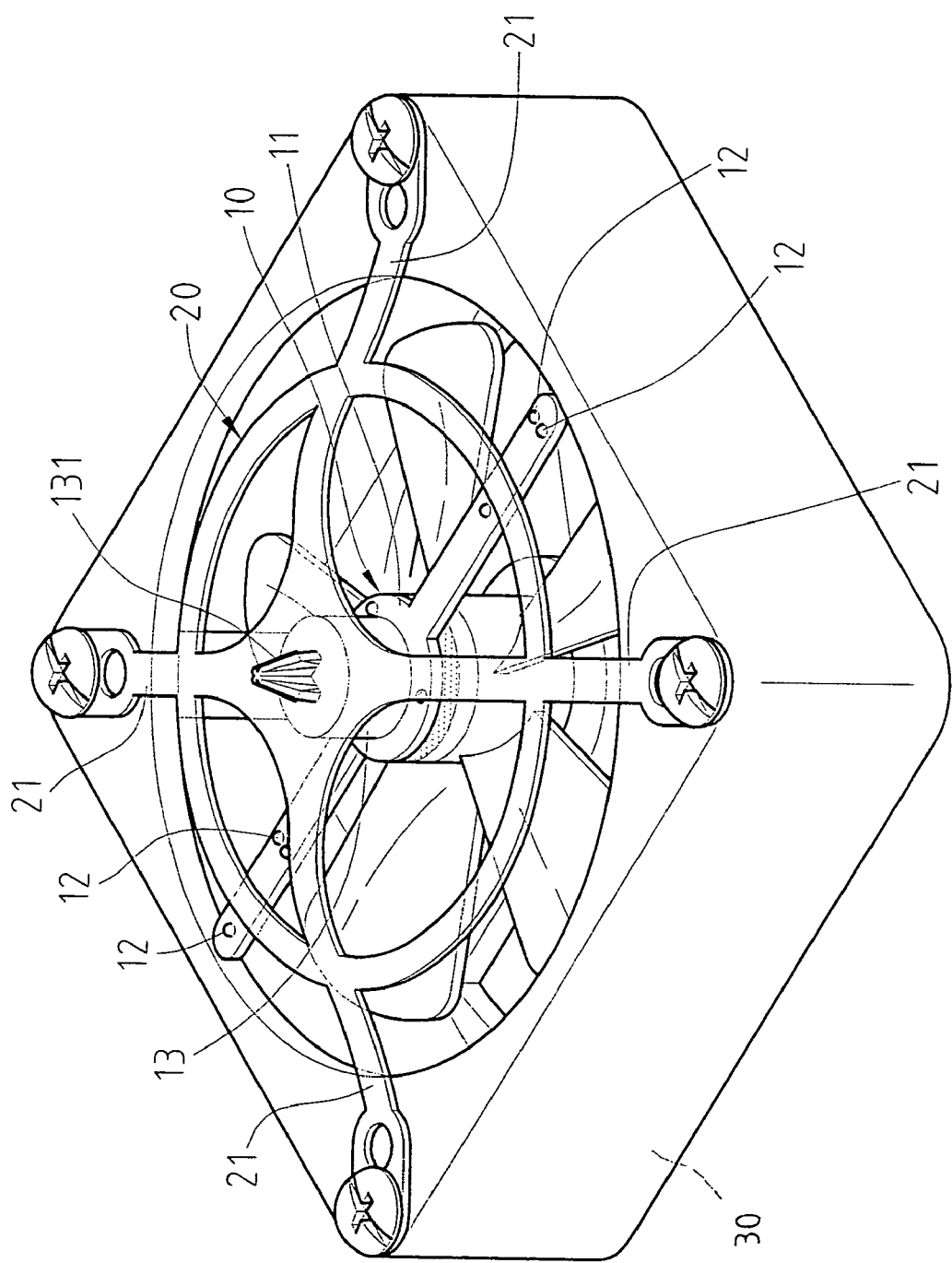
FIG. 2 is a perspective view of the assembled illumination device and the fan.
Figure 3:
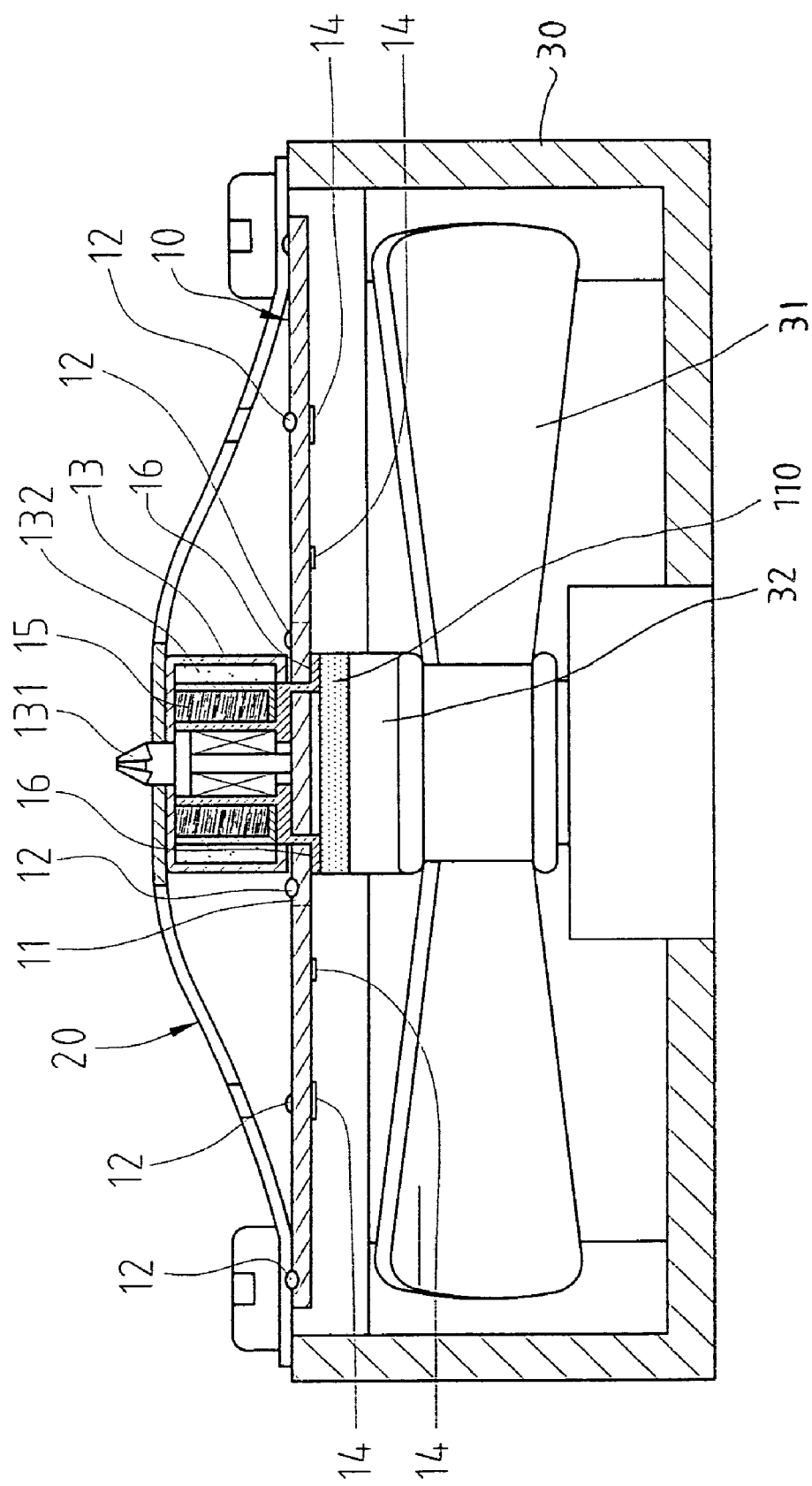
FIG. 3 is a sectional view of FIG. 2.

Referring to FIGS. 1 to 4, there is shown an illumination device mounted on a fan of a computer having a transparent case in accordance with the invention. The illumination device comprises a rotating member 10 and a fixed member 20. Each component will be described in detailed below.

The elongate rotating member 10 comprises a central, circular coupling member 11 and a two-sided foam tape 110 adhesively interconnected a bottom of the coupling member 11 and a flat top of a hub 32 of a fan 30 having a plurality of blades 31 such that the rotating member 10 and the fan 31 can rotate together in response to turning on a computer (not shown). The rotating member 10 further comprises a plurality of light-emitting members (e.g., light-emitting diodes (LEDs)) 12 disposed on its upper surface, and a cylindrical receptacle 13 formed above the coupling member 11 by a very small distance, the receptacle 13 having a cross-shaped, pointed head 131 and an internal, cylindrical electromagnet 132.

The rotating member 10 further comprises a plurality of IC based control circuits 14 provided on a bottom each for controlling the on or off of the corresponding light-emitting member(s) 12, a coil of wire 15 surrounded by the electromagnet 132, an upper positive terminal 16, and a lower negative terminal 16. The terminals 16, the light-emitting members 12, and the control circuits 14 form a circuit.

The fixed member 20 is of cross-shaped with a circular frame element interconnected intermediate portions of four legs 21. End of each leg 21 has two threaded holes so that a fastener (e.g., screw) can be driven therethrough into the housing of the fan 30 for securing the fixed member 20 to the fan 30. The fixed member 20 further comprises a cross-shaped slot 22 in a center thereof. The head 131 is adapted to insert through the slot 22 for fastening the receptacle 13 and the fixed member 20 together.

Figure 4:
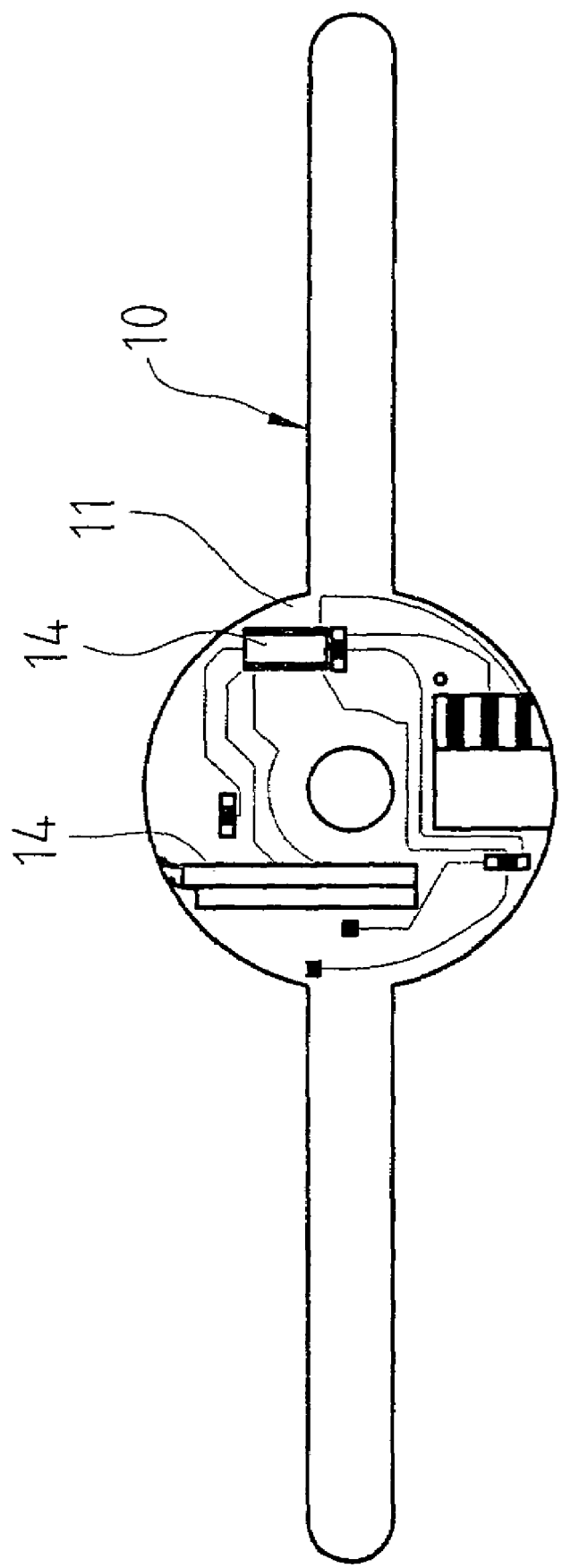
FIG. 4 is a schematic top view showing control circuits mounted in a coupling member of the rotating member.
Figure 5:
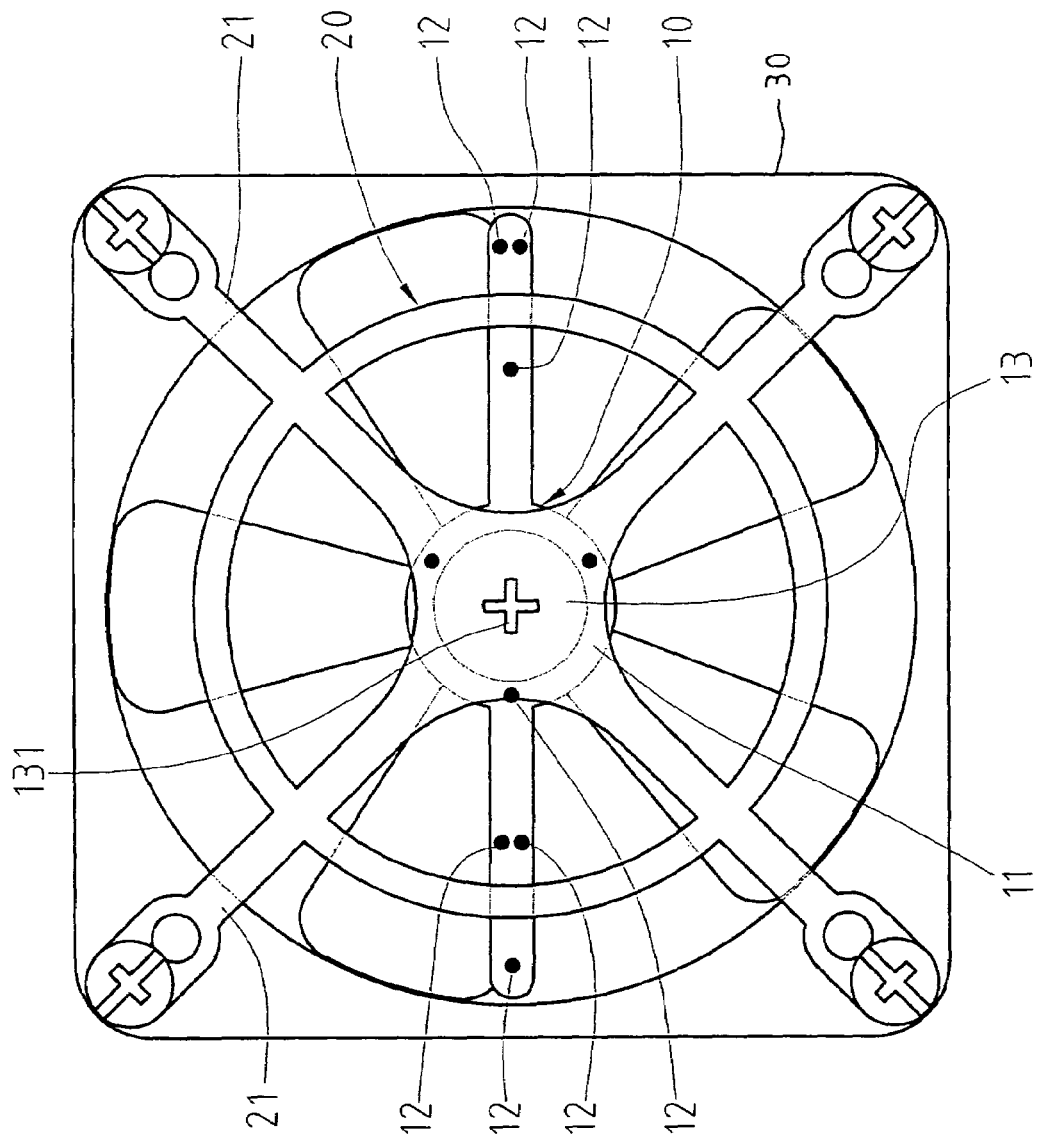
FIGS. 5 and 6 are top plan views of FIG. 2 showing non-operating and operating states of the invention.
Figure 6:
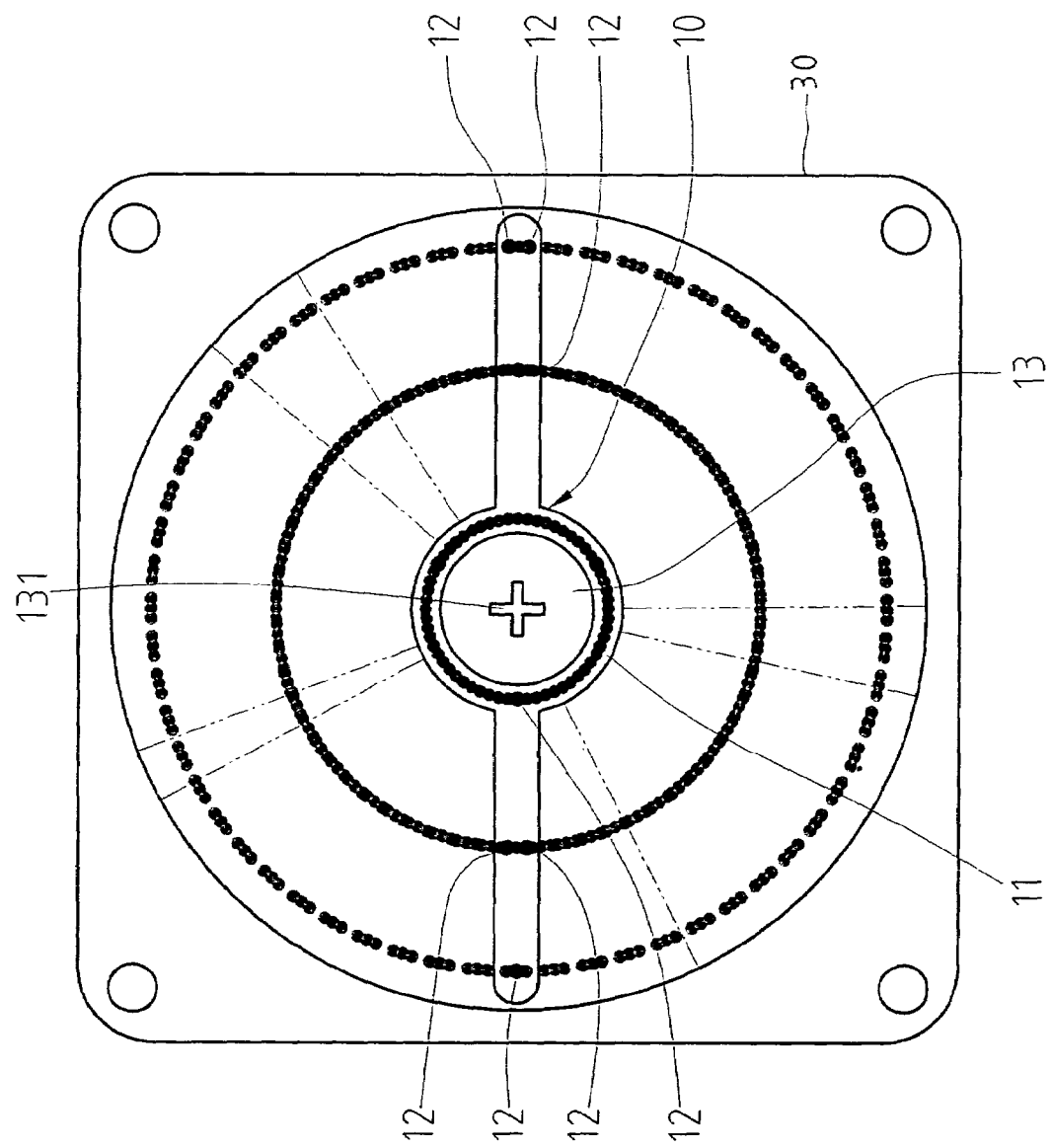

Referring to FIGS. 5 and 6 in conjunction with FIGS. 1 and 4, an operation of the invention will be described in detailed below. In response to turning on the computer and thus the fan 30, the rotating member 10 rotates. At the same time, the coil of wire 15 rotates and both the receptacle 13 and the electromagnet 132 remain motionless. Magnetic lines across a space defined by the electromagnet 132 will be cut by the coil of wire 15. As such, a voltage is induced in the terminals 16. As a result, the light-emitting members 12 are illuminated. Note that in one example each light-emitting member 12 is adapted to emit light having brightness different from the others or flash. Thus, a desired illumination or flashing effect can be obtained (see FIG. 6). Moreover, brightness and/or flashing of the light-emitting members 12 can be periodically changed by the control circuits 14 when the computer operates. As a result, a user can be visually informed of the normal operation of the fan 30 by the illuminated and/or flashed illumination device.

While the invention herein disclosed has been described by means of specific embodiments, numerous modifications and variations could be made thereto by those skilled in the art without departing from the scope and spirit of the invention set forth in the claims.

What is claimed is:

1. An illumination device for a fan of a computer having a transparent case, comprising:

a rotating member releasably secured to a hub of the fan and including a plurality of light-emitting members disposed on an upper surface, a receptacle formed above a center by a predetermined distance, the receptacle including a projected head and an internal electromagnet, a plurality of control circuits provided on a bottom each for periodically controlling an on or off of one or more of the light-emitting members, a coil of wire surrounded by the electromagnet, and positive and negative terminals wherein the terminals, the light-emitting members, and the control circuits form a circuit; and a fixed member releasably secured to the fan and including a central slot snugly coupled to the head for fastening the receptacle and the fixed member together, whereby turning on the computer, the fan, the rotating member, and the coil of wire will rotate so as to cut magnetic lines across a space defined by the electromagnet, induce a voltage in the terminals, and illuminate or flash the light-emitting members.

2. The illumination device of claim 1, wherein the light-emitting member is a LED.

3. The illumination device of claim 1, wherein the fixed member is of cross-shaped with a circular frame element interconnected intermediate portions of four legs thereof.

4. The illumination device of claim 1, further comprising a two-sided foam tape adhesively interconnected a bottom of the rotating member and the hub of the fan.

5. The illumination device of claim 1, wherein the rotating member is elongate.

6. The illumination device of claim 1, wherein the head is of cross-shaped and pointed.

7. The illumination device of claim 1, wherein the slot is of cross-shaped.

* * * * *